United States Patent [19]

Wand

[11] Patent Number: 4,868,445

[45] Date of Patent: Sep. 19, 1989

[54] SELF TUNED ULTRASONIC GENERATOR SYSTEM HAVING WIDE FREQUENCY RANGE AND HIGH EFFICIENCY

[76] Inventor: Saul N. Wand, 7 Vanderbilt La., Old Bethpage, N.Y. 11804

[21] Appl. No.: 208,776

[22] Filed: Jun. 20, 1988

[51] Int. Cl.⁴ .......................................... H01L 41/08
[52] U.S. Cl. .................................................. 310/316
[58] Field of Search ............................... 310/314–319; 318/116, 118

[56] References Cited

U.S. PATENT DOCUMENTS

| | | | |
|---|---|---|---|
| 3,842,340 | 10/1974 | Brandquist | 310/316 X |
| 3,931,533 | 1/1976 | Raso | 310/316 |
| 3,975,650 | 8/1976 | Payne | 310/316 |
| 4,271,371 | 6/1981 | Furuichi et al. | 310/316 |
| 4,275,363 | 6/1981 | Mishiro | 310/316 X |
| 4,277,758 | 7/1981 | Mishiro | 310/316 X |
| 4,371,816 | 2/1983 | Wieser | 310/316 X |
| 4,468,581 | 8/1984 | Okada et al. | 310/316 |
| 4,626,728 | 12/1986 | Flachenecker | 310/316 |
| 4,748,365 | 5/1988 | Poupaert | 310/316 |

Primary Examiner—Mark O. Budd
Attorney, Agent, or Firm—Edward H. Loveman

[57] ABSTRACT

This self tuned ultrasonic generator system for driving a piezoelectric transducer has a phase lock loop circuit for automatically finding and maintaining optimum drive of the transducer over a frequency range of at least 25% of a specified center frequency, regardless of variations of load, temperature, and configurations of the transducer. The loop circuit employs a voltage controlled oscillator driving a switching amplifier which powers the transducer. The signal from the oscillator is fed to a digital phase detector which receives as another input a sample of the current driving the transducer such that a phase comparison voltage from the detector is 15 applied to and controls the voltage of the oscillator. Another current sample is applied to a power supply to control the power supplied to the switching amplifier.

15 Claims, 4 Drawing Sheets

SELF TUNED ULTRASONIC GENERATOR SYSTEM HAVING WIDE FREQUENCY RANGE AND HIGH EFFICIENCY

BACKGROUND OF THE INVENTION

1. Field of the Invention

This invention relates to the art of electrical generator systems for driving piezoelectric transducers, and more particularly concerns such a system which generates driving signals over a wide band of frequencies and which employs signal sampling circuitry and feedback network loops.

2. Description of the Prior Art

Resonant operation of a piezoelectric transducer device may be defined as the frequency at which electrical to mechanical transformation takes place and may be graphically depicted by a rapidly changing phase shift with frequency. Since it is an energy exchange system, where the mechanical to electrical conversion is known to be reciprocal, abrupt changes in the load current phase presented by the piezoelectric device in motion result as energy is absorbed and reflected. Depending on whether the transducer is "squeezing" or "unsqueezing" in relation to its drive it may absorb or return electrical energy.

At frequencies below resonance for all high quality mechanically unloaded piezoelectric resonators including quartz crystals generally used for frequency control in communications equipment, the phase relationship is relatively fixed with the current leading the impressed voltage by approximately 90° much the same as in a capacitor and indicative of no mechanical motion. As frequency increases and vibration begins, the phase starts to lag going through 0° phase shift and finally to 90° lagging. The current magnitude reaches a peak at the 0° point which is generally referred to as series resonance, and goes to a minimum and nearly vanishes at 90° lagging, generally referred to as parallel resonance or anti-resonance. Further increase in frequency, results in the emergence of a current, which is again leading by approximately 90°, very much like a capacitor. The rate of phase change with frequency lessens above the 60° lagging point, culminating in a very slow change at 90°. This region is sought by many conventional generators having limited stability. Analysis of the phase angle to energy delivery indicates almost full energy delivery at 0° phase shift and almost full storage at 90°, with components of each elsewhere in the vibrating region. The resonance range, slope and smoothness of the phase curve changes with the temperature, power level, and mechanical load impressed upon the piezoelectric transducer. At the 0° phase shift point, the most power can be extracted with minimum voltage stress on the piezoelectric transducer.

In a mechanically loaded piezoelectric transducer with a fixed power input such that insufficient energy is available to overcome the load and provide for operation into the lagging phase angle storage region, stoppage of the transducer occurs prior to achieving a 90° lagging current. With sufficient load pressure no motion at all occurs, and the piezoelectric transducer becomes a passive capacitor throughout the entire range. When operation is at or near parallel resonance, energy is tending toward being fully reflected and high voltages are necessary to input power for conversion, thus burdening the piezoelectric transducer with dielectric breakdown and high reactive circulating current handling problems. The 90° lagging, parallel resonance point is at the end of the region where rapid phase shift with frequency and energy conversion occurs. After the 90° lag or parallel resonance point is reached, a discontinuity results, indicating an abrupt reversal of phase change with frequency, which mechanical load matching systems may smooth or cover to produce an apparent continuous phase sense reversal after the 90° lag point, where the phase leads increasingly with frequency until the phase returns to 90° leading and unchanging. This reversal of phase sense with frequency is very troublesome, preventing prior generator systems from achieving wide range, as all depend on a monotonic phase-frequency characteristic for correction of the transducer frequency.

Maintaining 0° phase shift, and increasing the mechanical load by applying a force directly opposite to the motion, causes a shift upward in the vibratory frequency that affords 0° until a reversal in phase change with frequency occurs. This signals sudden stoppage in transducer vibration and a return to a fixed approximately 90° lead. Increasing input power with load staves off the frequency increase and vibratory stoppage. Ultimately, however, with sufficient load, a limit is reached and the vibration must be allowed to stall if transducer damage is to be avoided. Heating of the vibratory transmission system generally lowers the frequency at which the 0° phase current occurs.

At the present state of the art, most generator circuits are more or less free running power oscillators only lightly influenced by the phase frequency relationship, due to difficulties in keeping the feedback from changing the frequency to points outside the resonance region, since the phase frequency relationship sense is undirectional only over a small region and may reverse suddenly under changing conditions of load, temperature, and drive level. When a phase lock loop is used, the delay associated with a resonating piezoelectric device is so great that loop stability is marginal at best and even undisturbed closed loop operation overshoots into the phase reversal region, with the consequent driving of the frequency above the frequency needed.

The prior art using the so called "self sterring" phase lock loop circuit encounters the difficulties identified and addressed herein. Circuits incorporating clamps, special amplifiers, such as disclosed in U.S. Pat. No. 4,056,761 and even microprocesseor control sequencing, such as disclosed in U.S. Pat. No. 4,577,500 to solve loop stability problems, achieve their objectives by compromising performance.

SUMMARY OF THE INVENTION

The present invention employs a phase sensing and locking circuit which overcomes the above mentioned difficulties and permits the generator system to use efficiently generated square waves. It also permits the input power to be freely adjusted to provide power increase, decrease or constancy under load characteristic while still maintaining the optimum frequency for efficient energy conversion tenaciously and instantaneously. It further operates various transducers with different mechanical structures and operation frequencies within a high percentage bandwidth without requiring any operational adjustment. Starting of transducer vibration is smooth without abrupt threshold requirements under loaded and unloaded conditions. According to the invention there is provided an electrical self tuned signal generator system which converts direct current to alternating current at optimum frequency and with such wave shape as will efficiently drive a piezoelectric transducer, for conversion of electrical energy to ultrasonic mechanical energy over a wider frequency range than has heretofore been possible.

The system employs an improved form of phase lock loop. The generator utilizes the loop to perform the energy conversion function automatically, finding and directly maintaining the optimum drive parameters over a wide frequency range of at least 25% of a predetermined preset frequency, regardless of system load, temperature, transducer configuration and manufacturing variations. Different transducers having different optimum oscillation frequencies within this wide frequency range or bandwidth are driven without any adjustment required to the driving electronics or to the transducer.

The attainment of the 25% direct phase lock loop range is a major advance in performance over that attainable with prior electrical drivers of piezoelectric transducers, which generally can attain a working range or bandwidth of 2% or less with respect to a specified operating frequency. The magnitude of operating frequency range is a major measure of performance of sonic transducer systems.

An operating range of at least 25% of set center frequency, by the present invention, leads to other significant advantages. The 25% range or bandwidth represents an operating range of from 19,000 to 25,000 cycles for one class of ultrasonic transducers designed to operate at approximately 22,000 cycles. This is more than adequate for present day manufacturing tolerances. Transducers of known quality and performance at 22,000 cycles normally require only a few hundred cycles tolerance. Under many applications, however, temperature, load and configuration variations cause optimum frequency of operation to shift more than 2,000 cycles. Accordingly, the present invention is able to accomodate this shift within its wide operating range. As a further advantage, the reliability of the present generator system itself is enhanced since drift in parameters of its own components which may change with temperature and time are compensated for by the wide range of the feedback loop.

In the present invention, loop performance is independent of the frequency generating waveform, thus allowing switching circuitry to provide high power levels with resulting low loss and economical circuitry. The loop performance is also independent of power input variations and permits a second feedback loop controlling power output to operate independently and effectively.

The loop stabilization is achieved by two unique networks incorporated in a transducer current sample feedback path. These networks overcome limitations in operation of a phase lock loop. True self tuned operation is afforded without restricting range to a particular transducer. No calibration is required for transducer variations or for temperature variation of the voltage controlled oscillator used by the generator system. The previous narrow operating range of prior generator systems has heretofore restricted and made prohibitively uneconomical or impractical the widespread employment of the useful aspects of ultrasonic energy in variable load, environment, and configuration applications. Instruments, appliances, tools and new previously unfeasible configurations of instruments and applications of ultrasonic energy may become more readily available as a consequence of this invention. By using modern electret piezoelectric transducers, a conversion of over 1000 micro-inches (25 microns) per watt is not unusual. Electrical to mechanical conversion efficiency exceeds 90% by using this invention, thus reducing heating of the piezoelectric transducer to negligible amounts even under heavy load.

These and other objects and many of the attendant advantages of this invention will be readily appreciated as the same becomes better understood by reference to the following detailed description when considered in connection with the accompanying drawings in which:

DESCRIPTION OF THE PREFERRED EMBODIMENTS

Figure 1:
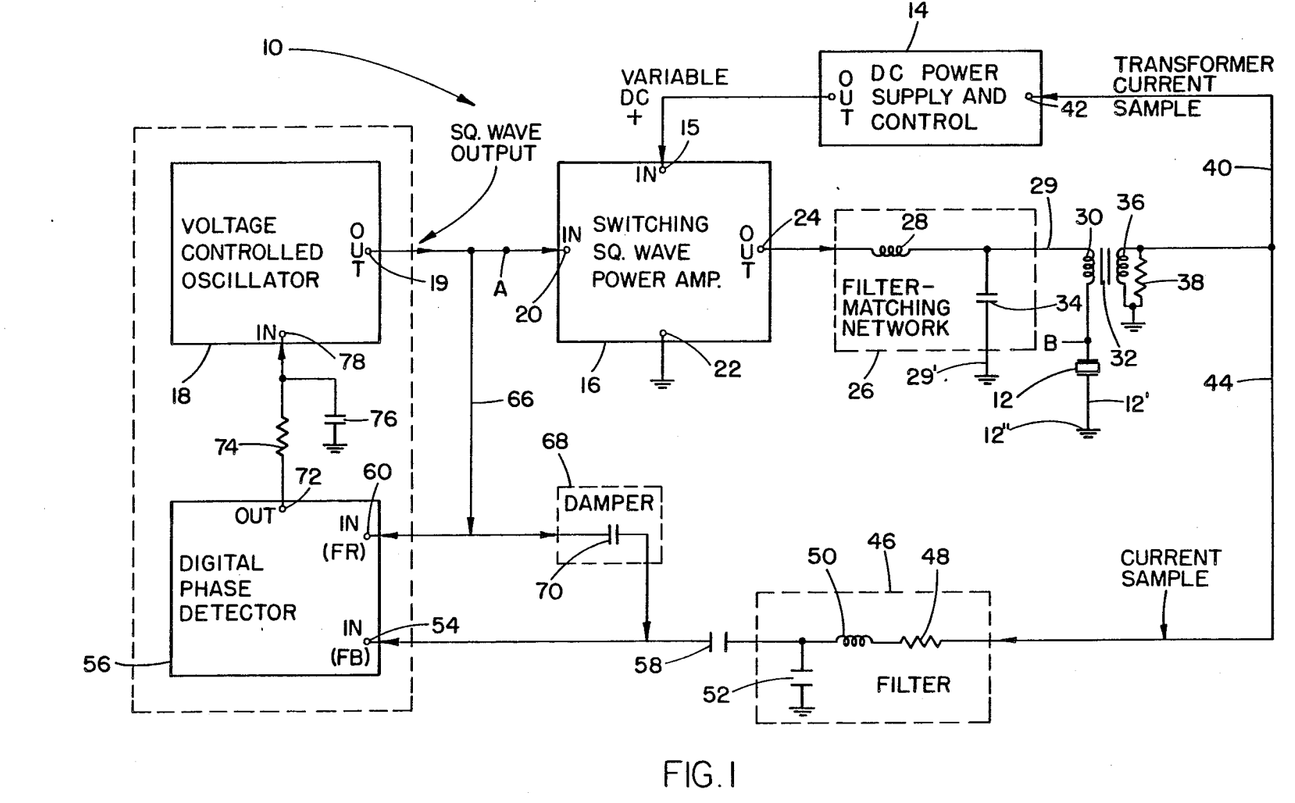
FIG. 1 is a block diagram of an ultrasonic generator system embodying the present invention.

Referring now to the drawings wherein like reference characters designate like or corresponding parts throughout, there is illustrated in FIG. 1 a self tuned ultrasonic generator system, generally designated as reference numeral 10, which converts direct current to alternating current having optimum frequency and shape necessary to drive, a piezoelectric transducer 12, for converting the applied electrical energy to mechanical energy over a wide frequency range.

A voltage controlled oscillator 18 applies a square wave from an output 19 to an input 20 of the amplifier 16. The amplifier 16 essentially operates as a highly efficient switch which alternately connects the positive direct current input 15 and a ground input 22 to an amplifier output 24. The alternating current output from the amplifier 24 is in turn impressed across a filter and a matching LC network 26, which has an inductor 28 connected between the amplifier output 24 and both a primary winding 30 of a transformer 32 and a capacitor 34. The capacitor 34 is connected to ground. The sine wave current appearing across the capacitor 34 is applied to the piezoelectric transducer 12 via the primary winding 30 to drive the transducer 12 for generating mechanical sonic vibrations.

The current appearing at a transformer secondary winding 36 is applied to a load resistor 38. A sample of the transformer output current is applied via a line 40 to an input 42 of the DC power supply and control circuit 14. The sample of the transformer output current is also applied via a line 44 to a filter network 46 which has a series connected resistor 48 and an inductor 50, and a parallel capacitor 52 connected to ground. The output from the filter 46 is applied as a feedback to an input 54 of a digital phase detector 56 through a capacitor 58. A reference input 60 of the digital phase detector 56 is connected to the output 19 of the voltage controlled oscillator 18 via a reference feed line 66.

A damper network 68 which is comprised of a capacitor 70 (or an equivalent circuit) is connected between the input 60 and the input 54 of the phase detector 56. An output 72 from the phase detector 56 is applied to a resistor 74 and then to a parallel connected capacitor 76 which integrate the output of the phase detector 56 with a time constant under one millisecond. The integrated output across the capacitor 76 is applied to an input frequency tuning terminal 78 of the oscillator 18 to complete the loop.

Figure 6:
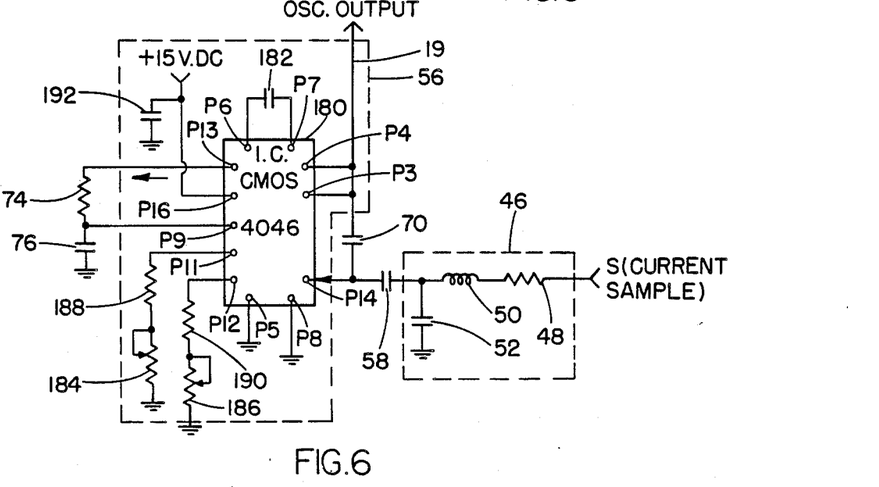
FIG. 6 is a schematic diagram of a phase detector and oscillator I.C. useful in the systems of FIGS. 1 and 2.

The digital phase detector 56, described in further detail below in connection with FIG. 6, is a complex digital circuit with three-state output and leading edge sense logic. The output 72 disconnects to an open circuit if the two inputs 54, 60 are and remain identical in phase. Normally, when the feedback signal (FB) at the input 54 leads the signal from the oscillator output 19, applied to the reference input 60 (FR) via the feed line 66, the output 72 of the phase detector 56 produces positive pulses which raise the input voltage and frequency of the oscillator 18. The phase detector 56 produces ground pulses which lower the oscillator input voltage and output frequency if the feedback input 54 lags the oscillator output sample 66 applied at the reference input 60.

The phase detector circuit 56 operates on a cycle of a pair of positive transitions alternately on the two inputs 54, 60. A transition on one input locks out that input and either a "1" or "0" is the output depending on which input was first, until a second transition appears at the other input. The second transition then opens both inputs for the next detection of positive edge transitions and simultaneously opens the detector output 72 to the floating state. During this period, when the detector 56 is waiting for the next edge pair, the detector 56 is vulnerable to a noise or stray spike pulse. In normal steady state operation, both of the inputs 54 and 60 are in phase only briefly due to the input impedance of the tuning port 78 of the oscillator 18. This impedance makes the voltage across the capacitor 76 droop, and this causes the oscillator frequency to decrease, but the oscillator frequency is restored by the appearance of a slight lead in the phase of the feedback input signal at the detector input 54. The detector 56 in turn sends a positive pulse of this lead duration from the output 72 which returns the voltage across the capacitor 76 to that needed to maintain the oscillator 18 at the frequency which provides 0° phase shift.

If a stray pulse from a noise spike or a sudden reflected transducer output from a mechanical load step or sound pressure occurs, before the next reference input transition to the input 60, a large false positive output could result at the output 72 and drive the output frequency of the oscillator 18 above the normal operating region into the region of phase sense reversal. The circuit 10 would hang up, constantly trying to raise the detector output frequency to get rid of the phase lead, which due to phase sense reversal only produces more phase lead. The filter 46 and the damper 68 are incorporated to prevent this loop failure.

The filter 46 serves several functions. It attenuates high frequency spikes and noise that may try to enter into the sine wave applied to the input 54. The filter 46 can be used to make up for any circuit phase shift between point A at the input 20 of the amplifier 16, and point B at an input to the piezoelectric transducer 12. The filter 46 works in conjunction with the damper 68 to provide an appropriate delay compensation. The rate of phase shift change with frequency caused by the components in the matching network 26 and in the filter 46 is small compared to that produced by the piezoelectric transducer 12 and is generally set to provide a transducer voltage-current phase relationship of from 15° lead to 0°. It will be noted that the filter 46 is a low pass filter broadened out with the series resistance 48. The filter 46 is totally passive. This is important to avoid introducing gain which would reduce noise immunity.

The phase detector 56 is quite capable of accurately operating with variations in input levels from its power supply level of fifteen volts down to 700 millivolts without any wave shaping or modification. The detector 56 has a selfbiased inverting buffer (not shown) at the feedback input 54. The capacitor 58 blocks the DC output from the filter 46 in order for this buffer to provide the only gain in the feedback path. At loop startup when the current sample input level on the line 44 is below the operating threshold of the phase detector 56, the initial frequency will automatically be at the lower band edge and sweep upwards in frequency which is desirable since any spurious responses of the transducer 12 will be above the operating frequency.

The damper 68 performs a significant damping function to prevent the loop response overshoots from building and driving the loop to the phase sense reversal region of the transducer 12. The damper 68 by means of the capacitor 70 adds the fast edge transition of the square wave going to the input 60, to the input 54 of the phase detector 56. When the phase at the feedback input 54 leads the phase at the reference input 60, the signal added by the damper 68 causes no effect. But when the phase at the feedback input 54 begins to lag the phase at the reference input 60, the effect is to shut out the action which would normally cause the detector output 72 to go low and reduce the frequency generated by the oscillator 18. Instead, having received a synchronous second edge, the output 72 of the phase detector 56 goes to the open state, and the frequency of the oscillator 18 is reduced gradually by the normal droop at the capacitor 76, due to the input impedance at the input 78 of oscillator 18, providing a very necessary digital integration. Without the damper 68, the sudden downward correction would soon produce overshoots into the reverse sense region, and consequent jump toward the high band edge. The overshoots are unavoidable due to the time delay associated with the transient response of the piezoelectric transducer 12 which is a tuned narrow band mechanically vibrating body with inherent inertia. The capacitor 70 of the damper 68 requires a capacitance value chosen such that a sufficient amount of the fast edge of the square wave signal, at the reference feed line 66, to the detector input 60, adds to the sine wave coming from the capacitor 58 without loading the input 54 unduly.

If desired, the circuit 10 may be operated by shorting or removing the inductor 50 if the inconvenience of precision adjustment of the high power components in the filter matching network 26 is tolerable.

Figure 2:
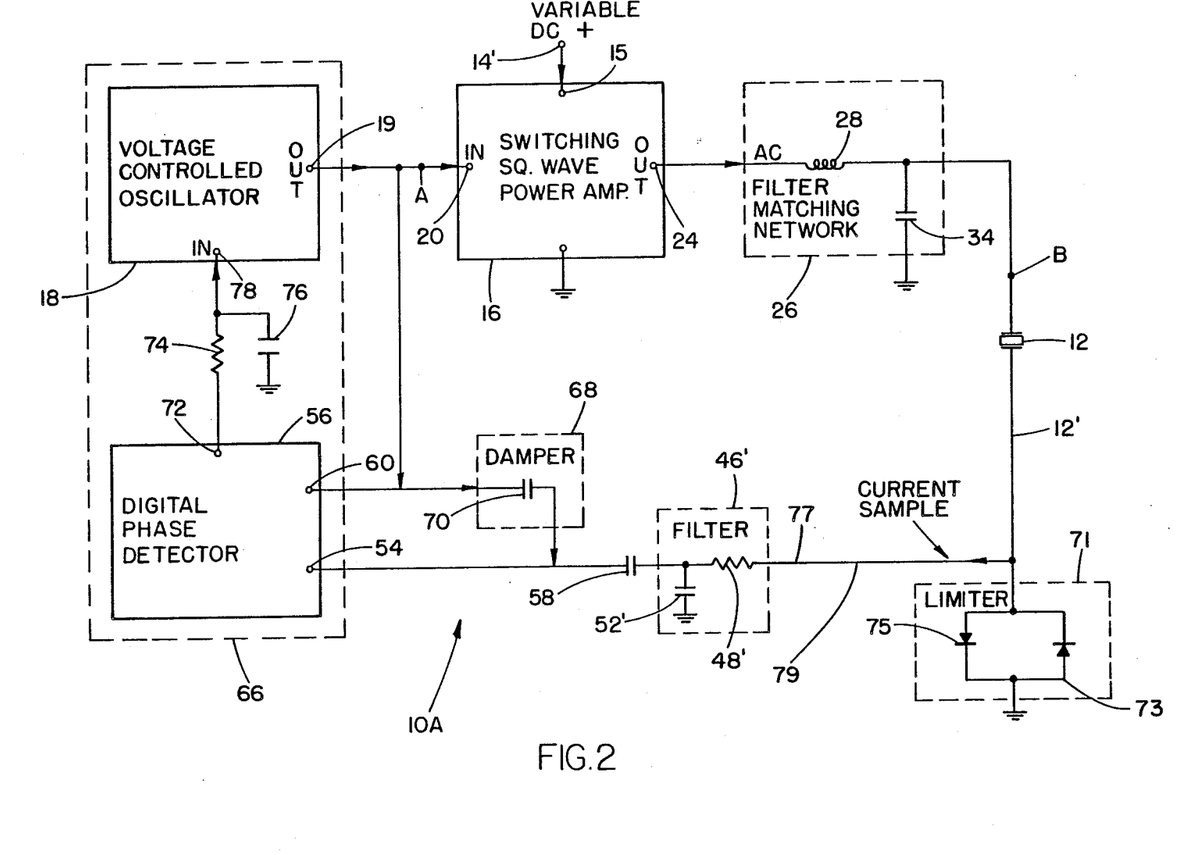
FIG. 2 is a block diagram of an ultrasonic generator system embodying modifications of the system of FIG. 1.

If isolation and power feedback is not required for any particular application, the system 10 can be simplified as shown by a system 10A in FIG. 2. System 10A employs the same numbered components as shown and described for the system 10 in FIG. 1, except that the transformer 32 and the DC power supply and control 14 in a feedback network are omitted. A variable DC is applied at the input 15 of the amplifier 16 from an independent power source 14'. A diode limiter 71 consisting of two diode rectifiers 73 and 75 connected in parallel, is placed in series with the return current from the transducer 12. A limited current sample 79 across the diodes 73, 75 is applied to an input 77 of a filter 46' which employs a series resistor 48' and a parallel capacitor 52' (the inductor 50 of the filter 46, being omitted, or shorted out). The filter 46' acts as an effective filter without the inductor 50. However no phase setting adjustment is available to make up for the phase shift between circuit points A and B. In this arrangement, the phase shift may be set to 0° by proper selection or adjustment of the inductor 28 and/or the capacitor 34 in the filter matching network 26. Except for the simplification provided by system 10A the arrangement and operation of system 10A is the same as described above for system 10.

Figure 3:
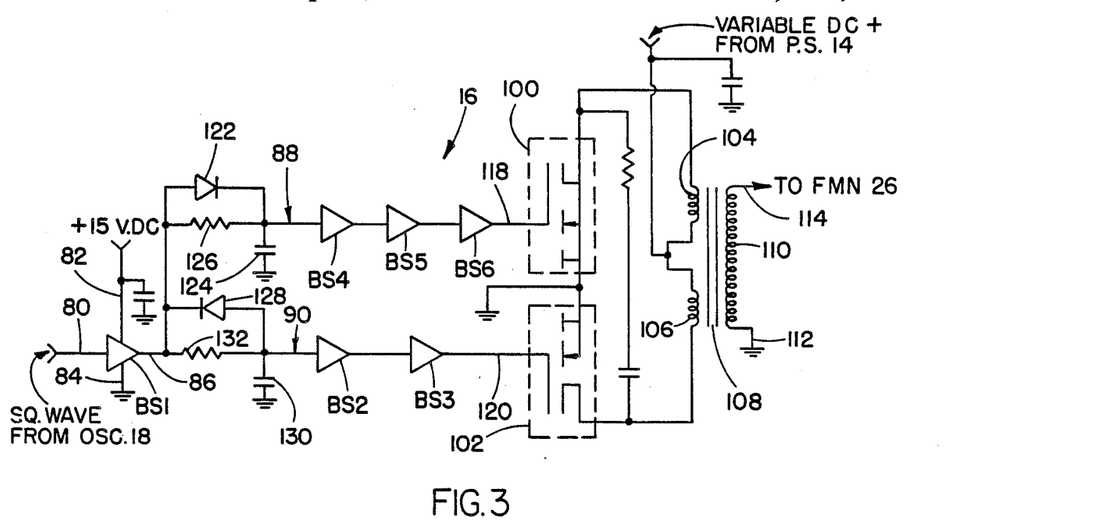
FIG. 3 is a schematic diagram of a switching power amplifier employed in the system of FIGS. 1 and 2.

FIG. 3 is a circuit diagram of a push pull switching square wave power amplifier, suitable for the amplifier 16 shown in FIGS. 1 & 2. A square wave at input 80 from the voltage controlled oscillator 18 is applied to a buffer stage BS1 of the amplifier 16 which is an inverting buffer assembly having six stages BS1 through BS6. Fifteen volts DC at an input line 82 supplies the operating power for the stages BS1 through BS6 which is a conventional hex inverting buffer IC such as CMOS RCA 4069 UBE. An output 86 of the buffer stage BS1 is split into two paths 88, 90. These two paths respectively terminate at field effect switching transistors 100 and 102. The two transistors 100, 102 respectively drive primary windings 104, 106 of a power transformer 108 which has a secondary winding 110, grounded at one end 112. The other end 114 of the secondary winding 110 is connected to the filter matching network 26.

The two paths 88, 90 serve to generate push-pull input signals to the field effect switching transistors 100, 102. To insure that only one field effect switching transistor is on at any one time, the positive leading edge of the signal appearing at each input 118 and 120 is delayed until the signal appearing on the opposite field effect transistor is well below its turnon voltage. This is accomplished by a diode 122, a capacitor 124, and a resistor 126 in the path 88, and by a diode 128, a capacitor 130 and a resistor 132 in the path 90. To insure low loss and minimum heating in the field effect transistors 100 and 102, the signals at inputs 118 and 120 have fast rise times since they are passed through respective buffer stages BS4, BS5, and BS6 in the path 118, and buffer stages BS2, and BS3, in the path 120. The transistors 100 and 102 alternately draw DC+ current through a respective primary winding 104, 106 of the transformer 108. The transformer 108 is a voltage step-up component producing an efficiently generated high power AC output at the secondary winding 110.

Figure 4:
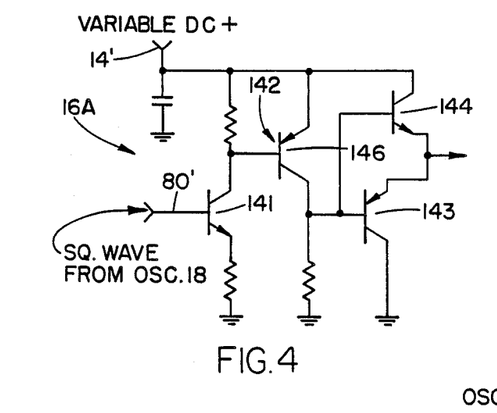
FIG. 4 is a schematic diagram of another power amplifier which may be employed in the system of FIG. 2.

The switching square wave power amplifier 16 shown in FIG. 3 and used in systems 10 and 10A of FIGS. 1 and 2, can be replaced in system 10A by a transformerless switching square wave power amplifier 16A shown in FIG. 4 which employs four amplifying transistors 141 through 144. The output from the square wave oscillator 18 is applied to the base of the transistor 141 which drives the transistor 142. The high voltage square wave output at a collector 146 of the transistor 142 is applied to both of the transistors 143 and 144. The PNP transistor 143 and NPN transistor 144 constitute a complementary pair which provide push-pull power gain. Since this transformerless amplifier 16A has no phase inversion, it can operate with the transformerless current sample 79 shown in FIG. 2. This simplified circuit arrangement is adaptable for use in low cost ultrasonic soldering, bonding, and other portable applications requiring low to moderate power.

The filter matching network 26 shown in FIGS. 1 and 2 receives the output from the switching amplifier 16. The output across the capacitor 34 can be connected to the piezoelectric transducer 12 in any one of three possible ways. One economical way is by using a diode limiter 71 having a pair of diodes 73, 75 as shown in FIG. 2. The diodes 73, 75 are arranged in series with a ground return 121 of the transducer 12 as shown in FIG. 2. A second method is by use of the current transformer 32 shown in FIG. 1. The primary winding 30 is connected in series with high side supply line 29 to the transducer 12. This permits grounding the ground return line 12' at a ground point 12" without affecting the current sample taken across the secondary resistor 38. The transformer 32 provides a sample of current amplitude and phase information on the line 44. The amplitude information is used to provide the feedback power control to be described below in connection with FIG. 7.

Figure 5:
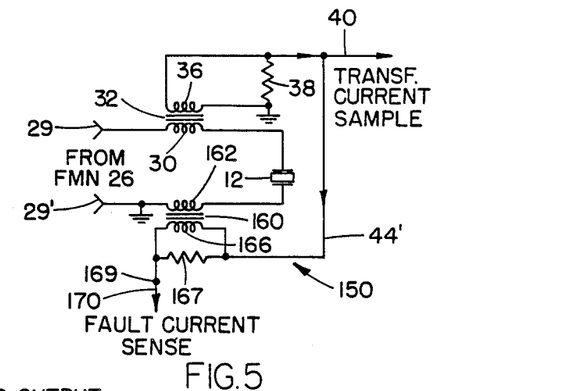
FIG. 5 is a schematic diagram of an alternate current sampling system which may be used in the system of FIG. 1.

A third arrangement illustrated in FIG. 5 for connecting the filter matching network 26 to the transducer 12 is by a sampling circuit 150 to replace the transformer arrangement shown in the system 10, FIG. 1. Here the transformer 32 is arranged as shown in FIG. 1 with the primary 30 connected from the output 29 of the network 26 to the high side of the transducer 12. An additional transformer 160 has a primary 162 connected between a grounded output 29' of the matching network 26 and the low side of the transducer 12. A secondary 166 of the transformer 160 is shunted by a resistor 167 and is connected to a terminal 169. This arrangement provides on a line 170 a ground fault detection signal by the amplitude comparison of the current sample provided by the secondary 36 of the transformer 32 on a line 44' and the secondary 166 of the transformer 160. The difference in the level of the two samples on the line 170 is used to provide quick shut off of the power input to the generator system 10 in the event of a ground fault at the transducer 12. A suitable fault current interrupter circuit is described below in connection with FIG. 7.

A sample of the current derived from the limiter 71 of FIG. 2, or from the transformer 32 of FIG. 1, or from both transformers 32 and 160 of FIG. 5, is passed to the digital phase detector 56 employed in both systems 10 and 10A of FIGS. 1 and 2 respectively. FIG. 6 shows circuit details of an integrated circuit 180 which is commercially available as an RCA CD 4046 CMOS IC which incorporates the voltage controlled oscillator 18 and the digital phase detector 56.

The current sample passes through the filter 46 or 46' (shown in FIG. 2). The filter 46 is comprised of the resistor 48 connected in series with the inductor 50 and in parallel with the capacitor 52 connected to ground. If the inductor 50 is omitted then the filter 46 has the configuration of the filter 46' of FIG. 2. The passive filter 46 or 46' is connected to the capacitor 58 which connects the ungrounded terminal of the capacitor 52 to a pin P14 of the integrated circuit 180 which is the feedback input 54, to the digital phase detector 56. The output of the phase detector 56 at a pin P13 is connected to the input of the oscillator 18 at a pin P9 through the resistor 74 which together with the capacitor 76 connected from a pin P9 to ground, integrates the phase detector output pulses with a time constant of less than one millisecond. The output from the oscillator 18 at a pin P4 supplies the reference input to the phase detector 56 by direct connection to a pin P3. As shown in FIGS. 1 and 2, this signal is also connected to the feedback input 54 at the pin P14, through the damper capacitor 70 which is connected between the pins P3 and P14. A pair of pins P5 and P8 are grounded. The square wave output of the oscillator 18 at pin P4 is also applied to the input of the power amplifier 16 as described above. A pin P16 is supplied with +15 volt DC to operate the integrated circuit 180.

The voltage controlled oscillator 18 is adjusted to operate with a 25% range about center frequency by a capacitor 182 connected across a pair of pins P6, P7, a variable resistor 184 in series with a resistor 188, connected to a pin P11, and a variable resistor 186 in series with a resistor 190 connected to a pin P12. The voltage controlled oscillator 18 in the RCA 4046 I.C. 180 has a published temperature stability of approximately 150 PPM per degree Celsius at its best operating voltage which is 15 volts DC. Without a wide band loop, this variability of output frequency on heating and cooling would require constant adjustment of the oscillator to maintain operation under temperature changes. In the present invention, the phase detector output is not restricted by clamping or other means to obtain loop stability. When the oscillator 18 is set for an operating range such that the center of operation occurs at a tuning voltage at pin 9 of 7.5 volts at 25° C., the circuit still gives successful operation even at extreme temperature of from +70° C. to −20° C. with a change in the 7.5 volt point from 13 volts to 2 volts. Commercially produced voltage controlled oscillators having greater stability such as the INTERSIL TYPE ICL8038 are available with 50 PPM stability, enabling even wider temperature operations.

Figure 7:
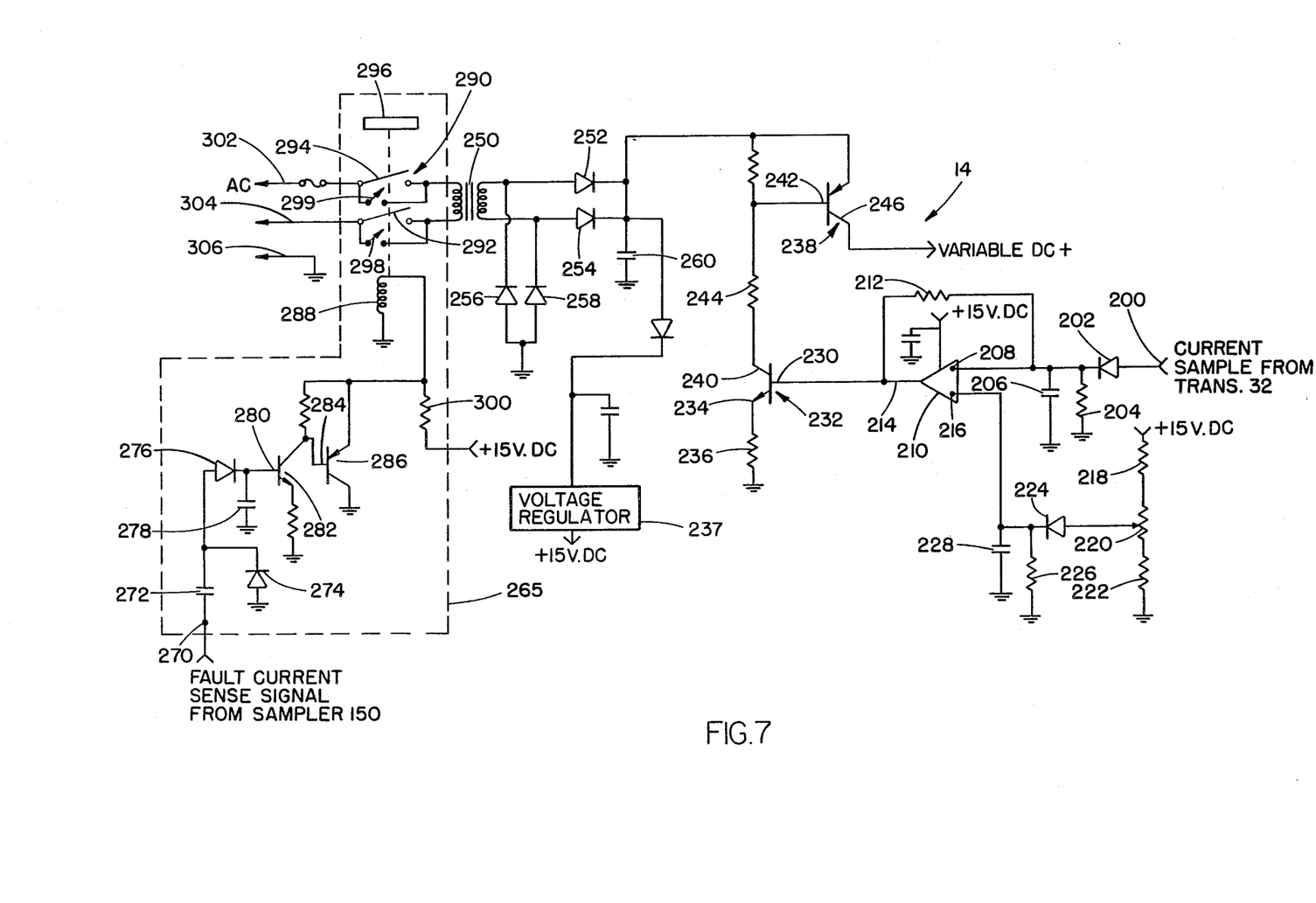
FIG. 7 is a schematic diagram of direct current power supply and power control circuitry, along with fault current sensing and current interruptor circuitry, which may be used in the systems of FIG. 1

FIG. 7 is a schematic diagram of a power supply and power control circuit 14 forming part of the system 10 shown in FIG. 1. The current sample from the transformer 32 is applied at an input 200 to a diode 202 where the current is peak detected and then filtered by a grounded capacitor 206 in parallel with a resistor 204 which provides a DC voltage at an inverting input 208 of an operational amplifier 210, such as found in a Motorola LM2904. A noninverting input 216 of the amplifier 210 is connected to an adjustable DC reference determined by a fixed pair of resistors 218, 222 and an adjustable resistor 220 through a compensating diode 224. Any temperature change affecting the diode 202 similarly affects the diode 224, cancelling the change, especially since the diode 224 is operating at the same current level being shunted by a resistor 226 which is equal in value to the resister 204. A smoothing capacitor 228 is grounded and parallel to the resistor 226. The resistor 220 is a potentiometer, allowing manual control of the power level. A resistor 212 is connected from an output 214 to the inverting input 208 and sets a moderate gain for the amplifier 210.

The output from the operational amplifier 210 is applied to the base 230 of an NPN amplifier transistor 232. An emitter 234 is grounded via a resistor 236. The transistor 232 in turn controls a PNP transistor 238. A collector 240 of the transistor 230 is connected to a base, 242 of the transistor 238 via a resistor 244. At the collector 246 of the transistor 238 appears the variable DC which is applied to the switching square wave amplifier 16 in the system 10 shown in FIG. 1.

In operation, the circuit 14 adjusts the variable DC voltage to maintain constant current through piezoelectric transducer 12 shown in FIG. 1. By introducing nonlinearity in the conversion of the current sample from the transformer 32 (see FIGS. 1 and 5) to DC, the power feedback curve can be made to provide a variety of power control characteristics.

For the sake of simplicity and clarity, the circuit 14 as described illustrates a linear non-switching variable DC power control system. However, the transistors 234 and 238 can be replaced by a switching type regulator which provides the variable DC, controlled by the output of the amplifier 210, for greater efficiency. The unregulated DC source is provided by a transformer 250; a diode bridge 252,254,256,258 and a capacitor 260 in a conventional full wave power supply arrangement. The +15 volt DC power may be provided by a regulator 237 such as a Motorola type 7815 or other conventional well known regulator.

System 10 can be provided with a fault, current interrupter circuit 265, shown enclosed in dotted lines in FIG. 7, and associated with the power control circuit 14. The fault current sensing signal, provided by the sampling circuit 150 (FIG. 5), is applied at input terminal 270. The circuit 150 sums the amplitude of the current sample from the transformer 32 with a reversed output of the current sample from the transformer 160. The amplitude sum has zero magnitude if the currents from the transformers 32 and 160 are equal, indicating the supply current into the transducer 12 is the same as the return current.

In the circuit 265, the fault current sense signal is peak-to-peak detected using a capacitor 272, a pair of diodes 274, 276 and a capacitor 278 to produce a positive output should a fault signal appear. The fault signal is applied to a base 280 of an NPN transistor amplifier 282 the collector of which is connected to a base of a PNP transistor amplifier 286. The output from the transistor 286 is connected across a coil 288 of a relay 290, which has normally open contacts 292, 294. The relay 290 is also provided with a manually operable pushbutton 296. In operation, the relay 290 is latched by momentarily closing the contacts 292 and 294 with the pushbutton 296, provided in the construction of the relay, similar to a circuit breaker. Alternatively, the relay 290 can be latched closed by means of a normally open double pole pushbutton switch 298, 299.

The relay 290 latches (picks and holds) by drawing current through a resistor 300, which is connected to a source of 15 volts DC. The presence of a fault current, at the input 270, will result in the transistor 286 turning on, shunting the current in the relay coil 288 to ground, thereby de-energizing it and shutting off the AC supplied at lines 302,304. This ground fault protection arrangement may operate with additional conventional ground fault protection in the AC line supply. It is an additional safeguard for local ultrasonic frequency ground faults which may not show up on a remote conventional ground fault protector.

It should be understood that the foregoing relates to only a limited number of preferred embodiments of the invention, which have been presented by way of example only, and that it is intended to cover all changes and modifications of the examples of the invention herein chosen for the purpose of the disclosure, which do not constitute departures from the spirit and scope of the invention.

What is claimed:

1. An electrical signal generator system for driving a piezoelectric transducer to produce mechanical vibrations, and for automatically maintaining drive of said transducer over a frequency range of at least 25% of a specified optimum center frequency comprising;
   a voltage controlled oscillator for producing a prescribed waveform at a predetermined set frequency range;
   a switching amplifier connected in circuit with said oscillator and arranged to receive said waveform and to provide a high power alternating current output conforming to said waveform, to drive said transistor;
   a current sampling network arranged to obtain a sample of said current output;
   a phase detector connected to said oscillator, said phase detector having:
      a first input connected to said oscillator to receive reference pulses therefrom,
      a second input connected to said current sampling network to receive said current sample sample therefrom,
      means to compare phases of said reference pulses and said current sample and to generate comparision pulses corresponding to differences in said compared phases,
      an output connected to said oscillator to apply said comparision pulses to said oscillator to keep said oscillator operating within said 25% range about said set frequency regardless of temperature changes of said oscillator; and
   damper means connected between said first input to said phase detector and said current sampling network to provide stability and maintain said frequency range.

2. An electrical signal generator system as defined in claim 1, further comprising:
   another current sampling network arranged to obtain another sample of said current output; and
   a power control circuit connected between said switching amplifier and said other current sampling network to control power output from said switching amplifier, independently of said waveform generated by said oscillator.

3. An electrical signal generator system as defined in claim 1, further comprising a filter network connected between said second input of said phase detector, and said current sampling network for attenuating noise and providing phase delay compensation to said current samples.

4. An electrical signal generator system as defined in claim 1 further comprising a filter connected to said switching amplifier to serve as a matching network to pass said high power current output to said transducer.

5. An electrical signal generator system as defined in claim 4 further comprising another filter network connected between said second input of said phase detector and said current sample applied thereto for smoothing said signal.

6. An electrical signal generator system as defined in claim 5, further comprising:
   another current sampling network arranged to obtain another sample of said current output; and
   a power control circuit connected between said switching amplifier and said other current sampling network to control power output from said switching amplifier, independently of said waveform generated by said oscillator.

7. An electrical generator system as defined in claim 1, wherein said switching amplifier comprises:
   a first buffer stage for receiving said waveform at low voltage from said oscillator and for passing said waveform into two paths;
   a first plurality of other buffer stages defining one of said paths;
   a second plurality of further buffer stages defining another of said paths;
   two field effect transistors, one at each end of one of said paths, for receiving push-pull signals from said paths so that only one of said transistors is on at a time; and
   a power transformer having primary and secondary windings, opposite ends of said primary winding being connected to said transistors respectively so that high power AC voltage appears across said secondary winding for application to said current sampling network and said transducer.

8. An electrical generator system as defined in claim 1, wherein said switching amplifier comprises first and second transistors for buffering and amplifying voltage of said waveforms applied to said switching amplifier; and
   third and fourth transistors connected to said second transistor as a complimentary pair to provide push-pull power gain of said voltage for applying the same to said transducer and to said current sampling network.

9. An electrical generator system as defined in claim 1, further comprising:
   another current sampling network arranged to obtain another sample of current output;
   a power control circuit connected between said switching amplifier and said other current sampling network to control power output from said switching amplifier independently of said waveform generated by said oscillator;
   an electronic filter network connected to said switching amplifier;
   a transformer having a primary and a secondary winding;
   said primary winding connected to said filter to pass alternating current from said switching amplifier to said transducer;
   said secondary winding connected to said power control circuit to supply said other current sampling network with said other sample of current output for actuating said power control circuit to control said power output from said switching amplifier.

10. An electrical generating system as defined in claim 9, further comprising another transformer having another primary winding and another secondary winding, said other primary connected to said transducer, and said other secondary winding connected to said current sampling network, whereby a fault current indication is obtained from said secondary winding in the event a ground fault occurs at said transducer.

11. An electrical signal generator as defined in claim 1, wherein said phase detector comprises an integrated circuit arranged to provide said comparison pulses; said system further comprising:
   a filter network connected between said second input to said phase detector and said current sampling network to apply filtered current samples to said integrated circuit.

12. An electrical generating system as defined in claim 2, wherein said power control circuit has an input means for receiving constant voltage DC, and other input means for receiving said other current samples from said other current sampling network; said power control circuit comprising an array of transistor amplifiers arranged to produce variable voltage DC corresponding to variations in said other current samples for application to said switching amplifier to maintain and control current drawn by said transducer.

13. An electrical generating system as defined in claim 12, further comprising a power interrupter circuit connected to said transformer and said other transformer and arranged to receive samples of current from said transformer and from said other transformer, said power interrupter circuit comprising:
   means for detecting a fault signal from said current samples from said transformers to produce a fault signal output; and
   relay means responsive to said fault signal output to cutoff power supplied to said transducer.

14. An electrical generating system as defined in claim 1 wherein said damper means comprises a capacitor.

15. An electrical generating system as defined in claim 1 further including a blocking capacitor connected between said current sampling network and said second input of said phase detector to prevent DC therefrom.

* * * * *